United States Patent
Son (12) 
(10) Patent No.: US 6,210,998 B1
(45) Date of Patent: Apr. 3, 2001

(54) SEMICONDUCTOR DEVICE FORMED ON AN INSULATOR AND HAVING A DAMAGED PORTION AT THE INTERFACE BETWEEN THE INSULATOR AND THE ACTIVE LAYER

(75) Inventor: Jeong Hwan Son, Taejeon (KR)

(73) Assignee: Hyundai Electronics Industries Co., Ltd., Hyounfki-Do (KR)

( * ) Notice: Subject to any disclaimer, the term of this patent is extended or adjusted under 35 U.S.C. 154(b) by 0 days.

(21) Appl. No.: 09/450,657

(22) Filed: Nov. 30, 1999

Related U.S. Application Data (62) Division of application No. 09/085,016, filed on May 28, 1998, now Pat. No. 6,023,088.

(30) Foreign Application Priority Data

Dec. 13, 1997 (KR) .................................................. 97-68562

(51) Int. Cl.⁷ ..................................................... H01L 21/00
(52) U.S. Cl. .......................... 438/162; 438/149; 438/479; 438/517; 438/157; 438/407; 257/347; 257/59; 257/63; 257/65; 257/66
(58) Field of Search .................................... 257/192, 607, 257/506, 347; 438/157, 291, 286, 407, 162, 479, 149

(56) References Cited

U.S. PATENT DOCUMENTS

| | | | |
|---|---|---|---|
| 5,698,869 | 12/1997 | Yoshimi et al. | 257/192 |
| 6,004,837 | * 12/1999 | Gambino et al. | 438/157 |
| 6,005,285 | * 12/1999 | Gardner et al. | 257/607 |

OTHER PUBLICATIONS

International Electron Devices Meeting 1993, Washington, D.C. Dec. 5–8, 1993, pp. 30.5.1–30.5.4.*

* cited by examiner

*Primary Examiner*—Eddie C. Lee
*Assistant Examiner*—Paul E Brock, II (57) ABSTRACT

The semiconductor device includes and the method for fabricating the same forms a damaged region under a gate electrode to improve device performance and simplify the process. The semiconductor device includes a substrate in which a buried insulating layer is formed; device isolating layers buried in first predetermined areas of the substrate to contact with the buried insulating layer; a gate electrode formed over a second predetermined area of the substrate; sidewall spacers formed on both sides of the gate electrode; source and drain regions at both sides of the gate electrode; and the damaged region at boundary of the buried insulating layer under the gate electrode.

12 Claims, 7 Drawing Sheets

SEMICONDUCTOR DEVICE FORMED ON AN INSULATOR AND HAVING A DAMAGED PORTION AT THE INTERFACE BETWEEN THE INSULATOR AND THE ACTIVE LAYER

This application is a divisional of Application Ser. No. 09/085,016, filed on May 28, 1998, now U.S. Pat. No. 6,023,088, the entire contents of which are hereby incorporated by reference.

BACKGROUND OF THE INVENTION

1. Field of the Invention

The present invention relates to a semiconductor device and, more particularly, to an SOI (silicon on insulator) MOSFET.

2. Discussion of the Related Art

A CMOS/SOI device is used to reduce parasitic capacitance, have an abrupt slope of threshold voltage, prevent short channel effect, and remove latchup of CMOS. However, this CMOS/SOI has some problems. The most significant problem is how to prevent parasitic capacitance in a floated body NMOSFET.

As collision ionization constant of holes is very low in a PMOSEET in comparison to an NMOSEET, the problem of parasitic capacitance is not so serious as in the NMOSFET. Recently research and development has been directed to how to prevent parasitic capacitance.

A conventional semiconductor and a conventional method for fabricating the same will be described with reference to the accompanying drawings.

Figure 1:
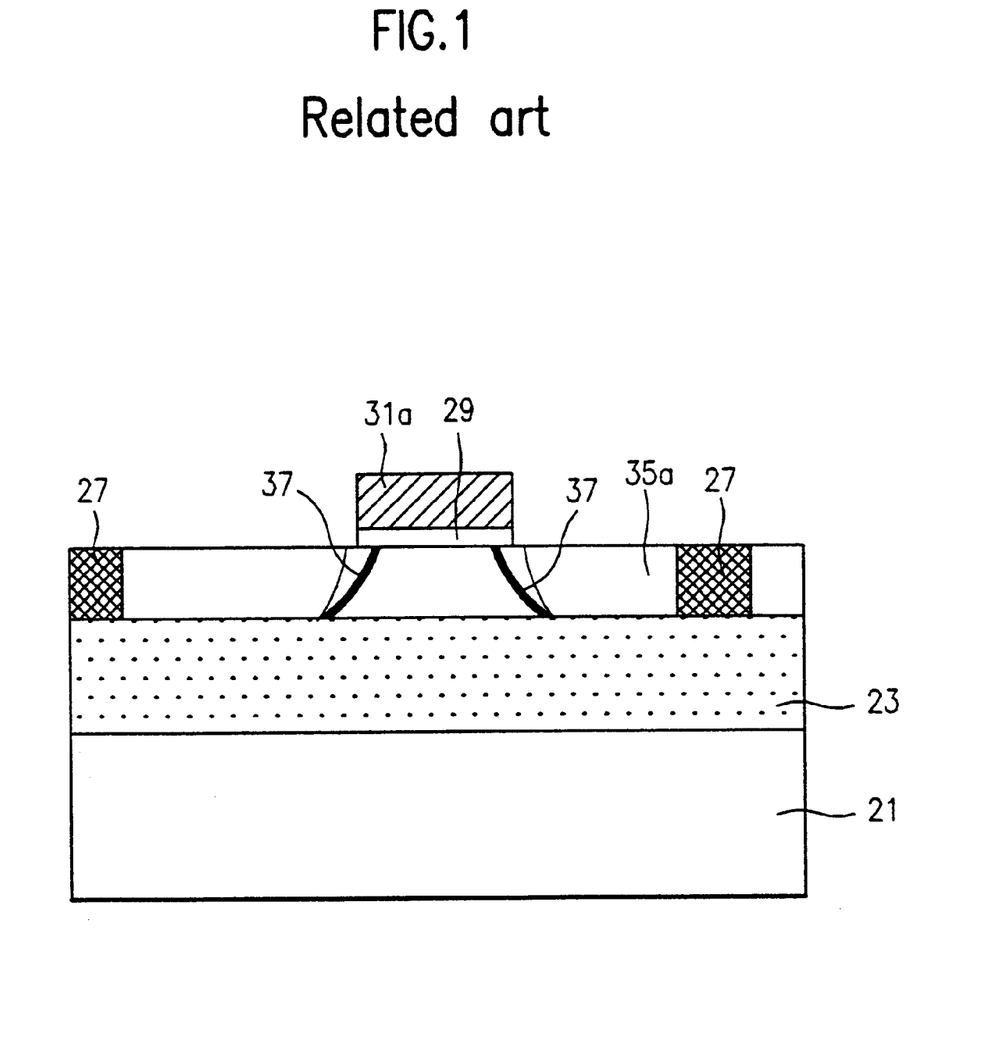
FIG. 1 is a cross-sectional view showing a structure of a conventional semiconductor device.

FIG. 1 is a cross-sectional view showing a structure of a conventional semiconductor device, including a substrate 21 in which a buried insulating layer 23 is formed, device isolating layers 27 under the surface of the substrate 21, a gate electrode 31a formed on the substrate 21 of an active region between the device isolating layers 27, and source/drain regions 35/35a formed beneath the surface of the substrate 21 at both sides of the gate electrode 31a.

The substrate 21 is of a p type of high resistance. The source/drain regions 35/35a are of an n type that is opposite to that of the substrate 21.

A method for fabricating the above described semiconductor substrate will be described with reference to the accompanying drawings.

FIGS. 2A to 2E are cross-sectional views showing process steps of a method for fabricating a semiconductor device.

Figure 2A:
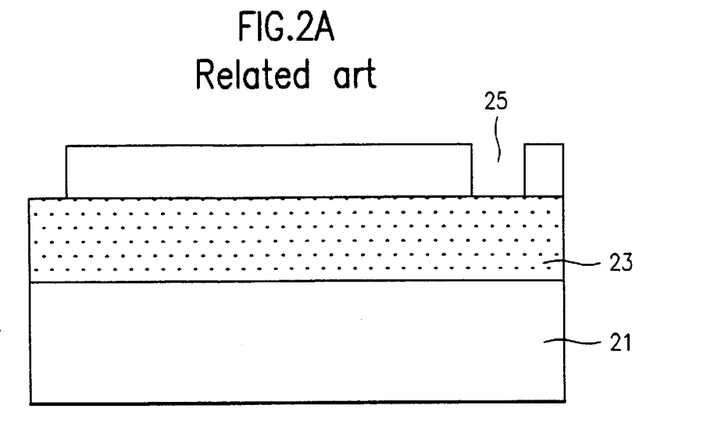
FIGS. 2A to 2E are cross-sectional views showing process steps of a conventional method for fabricating a semiconductor device.

Referring initially to FIG. 2A, a buried insulating layer 23 is formed in a p type semiconductor substrate 21. The buried insulating layer 23 is 100 nm thick. The active substrate 21 is 50 nm thick.

Thereafter, the substrate 21 is etched by a predetermined depth with a photo etching process to form trenches 25.

Figure 2B:
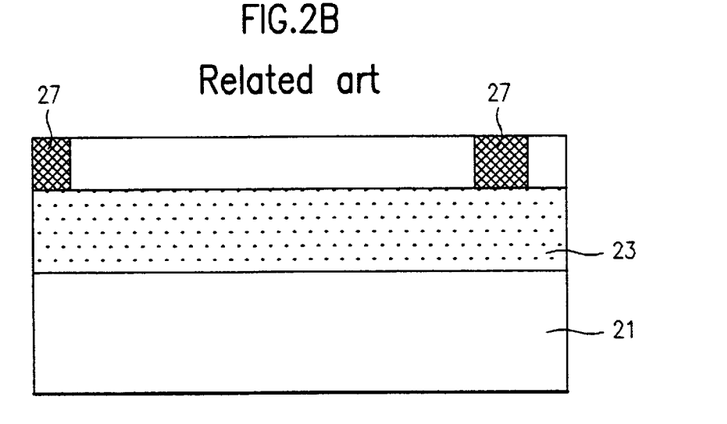

Referring to FIG. 2B, an insulator is buried in the trenches so that device isolating films 27 are formed. Next, a channel ion implanting process is performed for adjusting threshold voltage.

Figure 2C:
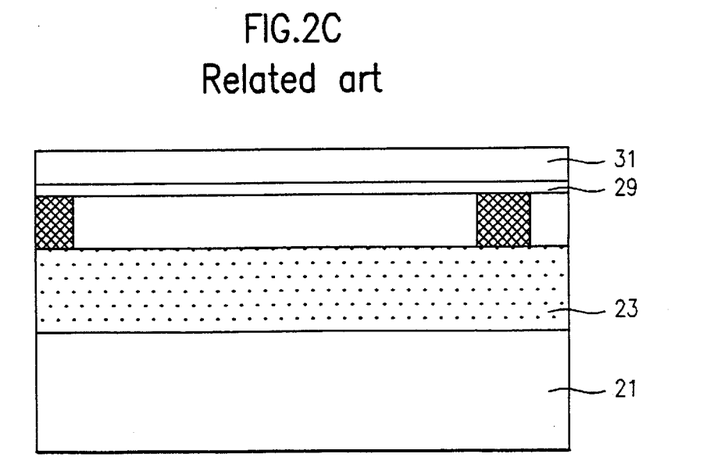

Referring to FIG. 2C, a 50 Angstrom thick gate insulating film 29 is grown and a doped polysilicon layer 31 is formed. At the polysilicon layer is doped with n type impurity ions to form an NMOS device, and the polysilicon layer is doped with p type impurity ions to form a PMOS device.

Figure 2D:
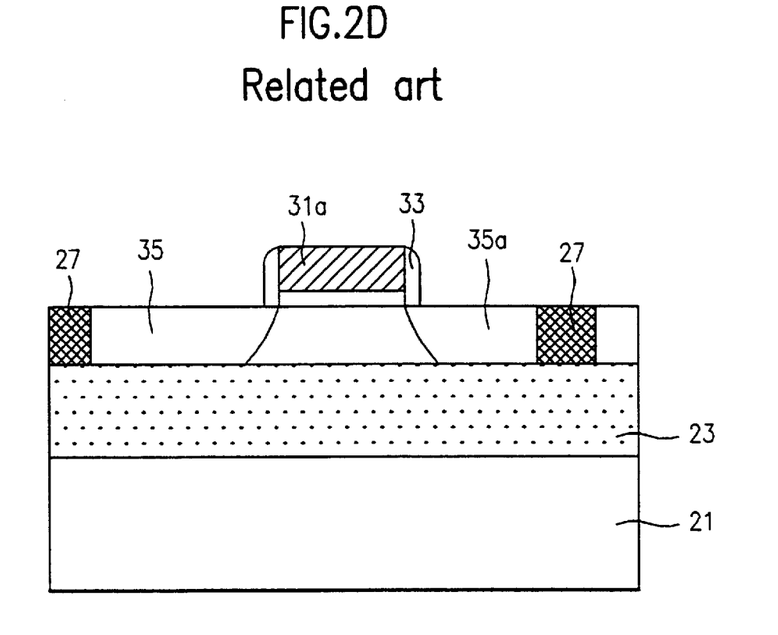

Referring to FIG. 2D, the polysilicon layer 31 is selectively removed to form a gate electrode 31a and gate insulator 29. Next, an insulating layer made of an oxide or a nitride is deposited on the entire surfaces including the gate electrode 31a. The insulating layer is etched-back to form sidewall spacers 33 on both sides of the gate electrode 31a. With the sidewall spacers 33 and the gate electrode 31a serving as masks, impurity ions are implanted to form source/drain regions 35/35a beneath the surface of the substrate 31 at both sides of the gate electrode 31a.

Figure 2E:
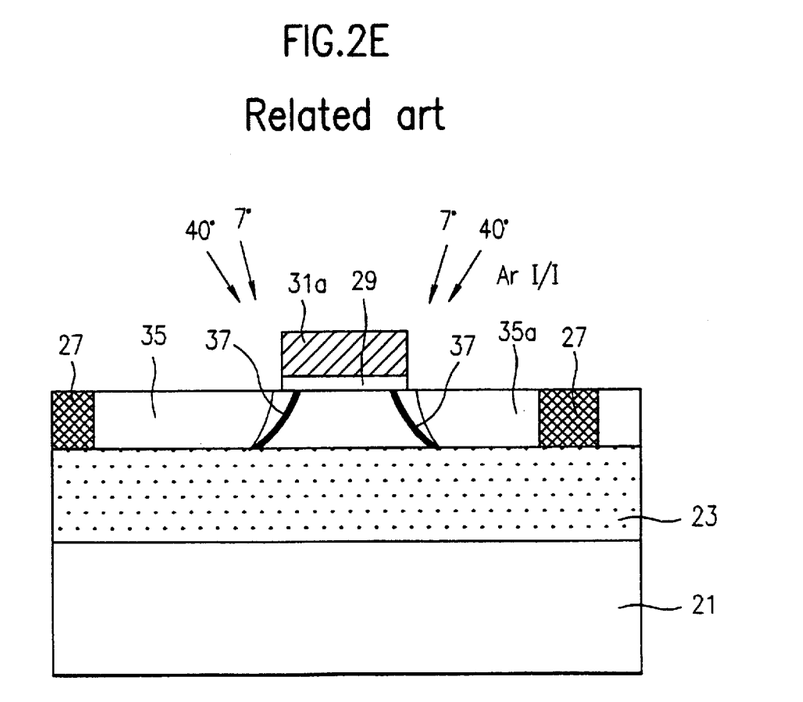

Referring to FIG. 2E, the sidewall spacers 33 are removed. Next, Argon Ar ions are implanted to form damage layers 37 along impurity junction. At this time, the tilt angle for implanting the impurity ions is 4~70° and the concentration of the ions is $2 \times 10^{14} cm^2$.

$R_p$ is formed along the boundary of the substrate 21 and the buried insulating layer 23 due to the ion implanting process and damage layers may thus be formed by an ion implanting process.

Thereafter, an RTA (rapid thermal annealing) process is performed at a temperature of 950° C. for 10 seconds.

A recombination center is formed in a parasitic bipolar transistor body in which source, body, and drain serve as emitter, base, and collector, respectively, thereby reducing the emitter injection efficiency.

Therefore, as for an NMOS, holes generated in a body easily go toward the source which acts as the emitter, so that deterioration of the floating body effect is prevented.

The conventional semiconductor device method for fabricating the same have the following problems. Since the damage generated at the boundary of a buried insulating layer and a substrate by an Ar ion implanting process affects a gate insulating layer, the reliability of the gate insulating layer becomes poor. Also the characteristic of hot carrier becomes poor since the damage is generated at the interface of the gate insulating layer. Further, the damage region is formed in source/drain regions, and the resistance of the source/drain is increased; thus reducing the current.

SUMMARY OF THE INVENTION therefore, the present invention is directed to an SOI MOSFET that substantially obviates one or more of problems due to limitations and disadvantages of the related art.

An object of the invention is to provide a semiconductor device and a method for fabricating the same in which the damage region is confined under a gate electrode to improve device performance and simplify the process.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device includes a substrate in which a buried insulating layer is formed; device isolating layers buried in predetermined areas of the substrate to contact with the buried insulating layer; a gate electrode formed on a predetermined area of the substrate of an active region between gate insulating layers; sidewall spacers formed on both sides of the gate electrode to have a thickness of thicker than the gate electrode; source and drain regions formed to have LDD regions formed beneath a surface of the substrate at both sides of the gate electrode; and a damage layer formed at boundary of the buried insulating layer under the gate electrode by implanting ions.

In another aspect of the present invention, a method for fabricating a semiconductor device includes the steps of forming a buried insulating layer in a substrate; burying an insulating layer in predetermined areas of the substrate to contact with the buried insulating layer to form device isolating layers; forming a gate insulating film on the substrate and forming a gate electrode having a cap insulating film; performing an LDD ion implanting process with the gate electrtode serving as a mask and forming sidewall spacers on both sides of the gate electrode to have a thickness of thicker than the gate electrode; removing the cap insulating layer and implanting Ar ions into the entire surface to form a damage layer at a boundary of the buried insulating layer under the gate electrode; and implanting impurity ions into the substrate at both sides of the gate electrode to form source/drain regions.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 3:
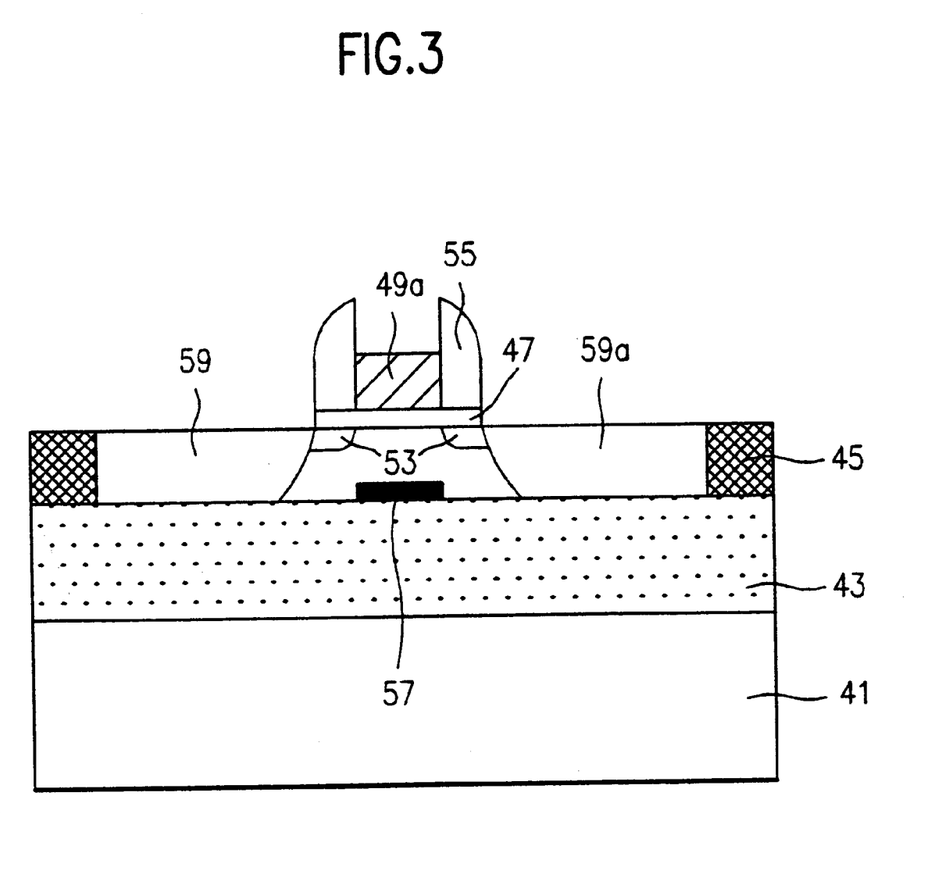
FIG. 3 is a cross-sectional view showing a structure of a semiconductor device according to the present invention.

FIG. 3 is a cross-sectional view showing a structure of a semiconductor device according to the present invention, and FIGS. 4A to 4G are cross-sectional views showing process steps of a method for fabricating the semiconductor device according to an embodiment of the present invention.

As shown in FIG. 3, a semiconductor device includes a substrate 41 in which a buried insulating layer 43 is formed, device isolating layers 45 formed beneath the surface of the substrate 41 to be connected with the buried insulating layer 43, a gate electrode 49a formed on a predetermined area of the substrate of an active region between the device isolating layers 45, sidewall spacers 55 formed at both sides of the electrode 49a to have a thickness thicker than the gate electrode 49a, and source/drain regions 59/59a formed beneath the surface of the substrate 41 at both sides of the gate electrode 49a to have LDD regions 53. A damage layer 57 is disposed under the gate electrode 49a in the active region of the substrate 41 at the boundary of the buried insulating layer 43.

At this time, the buried insulating layer is 1000–4000 Angstrom thick and the substrate 41 on the buried insulating layer 43 is 800–2000 Angstrom thick. The gate electrode 49a is made of in-situ doped polysilicon or undoped polysilicon.

A method for fabricating the above-structured semiconductor device will described with reference to the accompanying drawings.

Figure 4A:
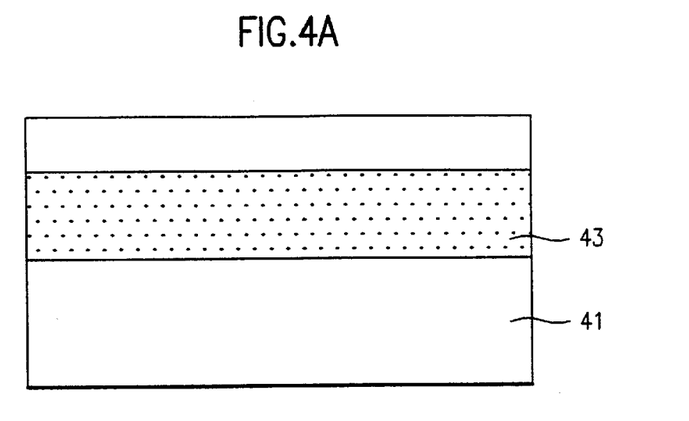
FIGS. 4A to 4G are cross-sectional views showing process steps of a method for fabricating a semiconductor device according to an embodiment of the present invention.

Referring initially to FIG. 4A, a buried insulating layer 43 is formed under the top surface of a semiconductor substrate 41. The buried insulating layer 43 is 1000–4000 Angstrom thick and the substrate 41 on the buried insulating layer 43 is 800–2000 Angstrom thick.

Figure 4B:
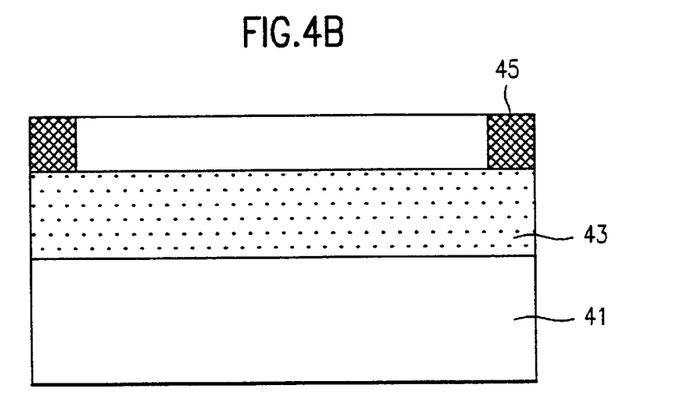

Referring to FIG. 4B, the semiconductor substrate 41 is selectively etched to expose the buried insulating layer 43, thus forming trenches. An insulator is buried in the trenches to form device isolating films 45.

In order to form device isolating layers, a LOCOS process can be performed instead of burying trenches.

Figure 4C:
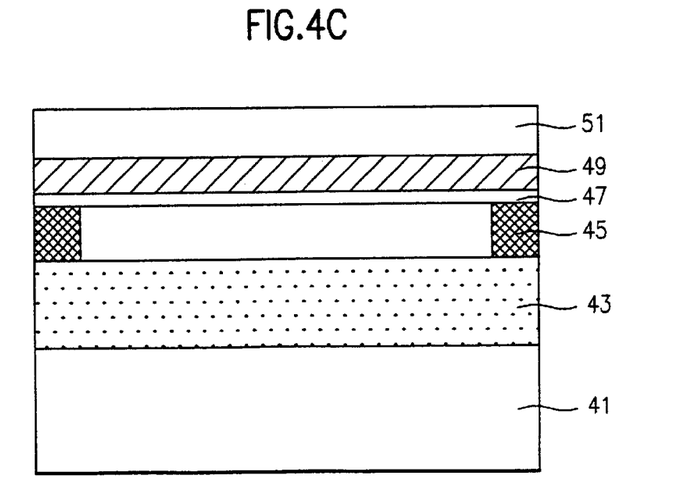

A gate insulating layer 47 is formed to be stacked on the substrate 41, and an in-situ doped polysilicon layer 49 and a nitride layer 51 are formed on the gate insulating layer 47. At this time, instead of the in-situ doped polysilicon layer 49, a stack of a polysilicon layer and a metal, a stack of a polysilicon layer and a silicide, or an undoped polysilicon can be formed.

The in-situ doped polysilicon layer 49 is 1000–2000 Angstrom thick. The nitride film 51 is used as a cap gate insulating layer.

Figure 4D:
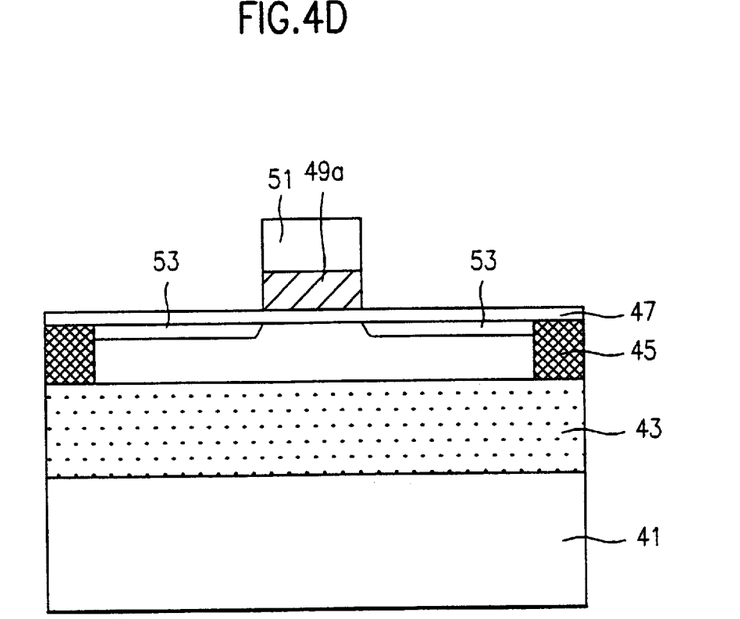

Referring to FIG. 4D, a photo etching process is performed to selectively remove the nitride film 51 and the in-situ doped polysilicon layer 49, thereby forming a gate electrode 49a having the cap gate insulating film. Next, impurity ions are implanted with the gate electrode 49a serving as a mask, thereby forming LDD regions 53 beneath the surface of the substrate 41 at both sides of the gate electrode 49a.

Figure 4E:
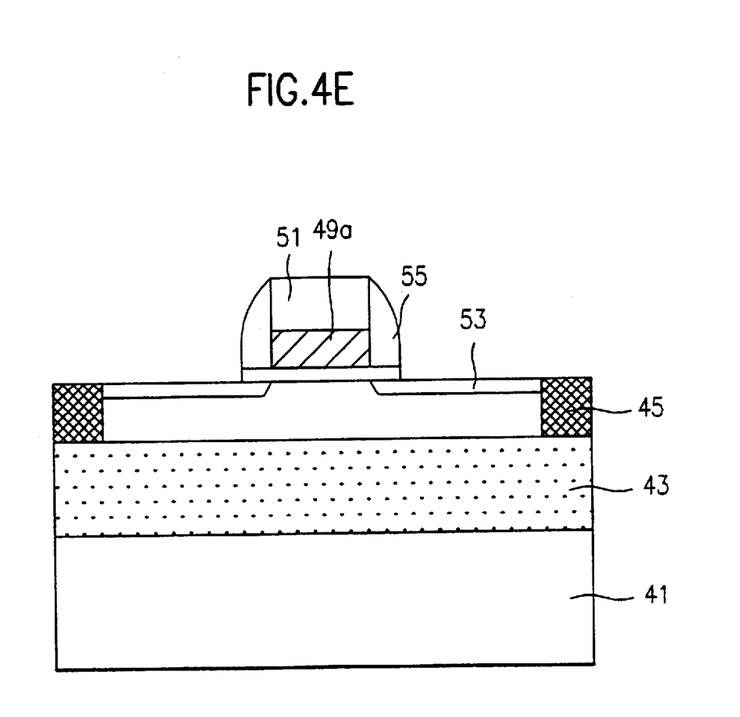

Referring to FIG. 4E, a silicon oxide Film having a high etch rate with the nitride film 51 is deposited on the entire surface of the substrate 41 including the nitride film 51. And it is etched-back to form sidewall spacers 55 on both sides or the gate electrode 49a and the nitride film 51.

Figure 4F:
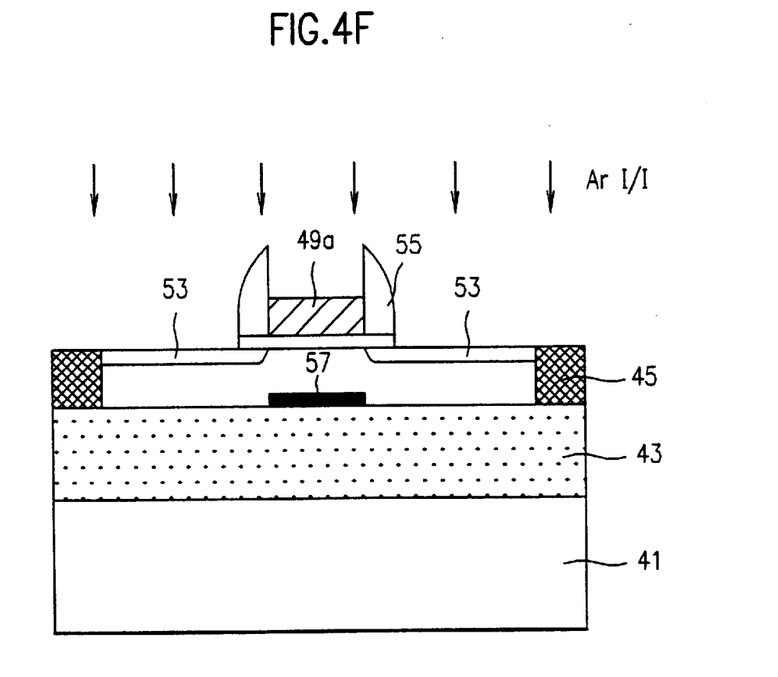

Referring to FIG. 4F, the nitride film 51 is removed. Argon ions are implanted into the entire surface including the sidewall spacers 55 and the gate electrode 49a. Instead of Ar ions, Ge ions or Si ions can be implanted. The concentration of the implanted ions is $1\times10^{14} cm^2$.

As the Ar ions are implanted, a damage layer 57 is generated with silicon lattice destroyed by Ar ions at boundary of the buried insulating layer 43 under the gate electrode 49a.

A location of the damage layer 57 is set by adjusting a thickness of the gate electrode 49a. In other words, when ions are implanted, the thickness of the gate electrode 49a should be taken into account for forming the damage layer 57 at the boundary of the buried insulating layer 43, as shown in FIG. 4F.

At this time, the gate electrode is 1000–2000 Angstrom thick.

The reason that the damage layer 57 is formed only under the gate electrode 49a is that Ar ions are implanted into the buried insulating layer 43, not into the substrate 41 at both sides of the gate electrode 49a. In other words, it is because that the distance between the buried insulating layer 43 and the top surface of the substrate 41 at both sides of the gate electrode 49a is shorter than the distance the gaze electrode 49a and the buried insulating layer 43. In addition to the thickness of the gate electrode 49a and an ion implanting energy, the thickness of the substrate 41 on the buried insulating layer 43 is also a factor that determines on a location of the damage layer 57.

Figure 4G:
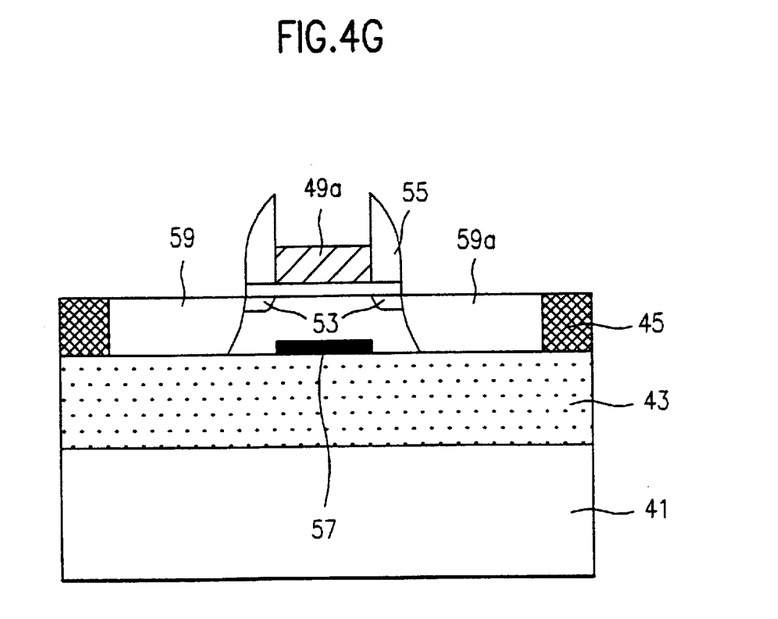

Referring to FIG. 4G, impurity ions are implanted with the sidewall spacers 55 and the gate electrode 49a serving as masks, thus forming source/drain regions 59/59a beneath the surface of the substrate at both sides of the gate electrode 41.

At this time, the source/drain regions 59/59a are of p type that is opposite to the type of the substrate 41.

A process of forming a silicide on the source/drain regions can be applied to reduce resistance of the source/drain regions 59/59a.

According to the, present invention, though the body electrically floats, carrier life time is shortened by a damage layer. Holes generated by the body according to NMOS operation artificially form by forming the damage layer at base of parasitic bipolar transistor.

The semiconductor device and the method for fabricating the same of the present invention have the following advantages. Since a damage layer is formed under a gate electrode, floating body effect is reduced so that device performance is improved. Further, source/drain resistance is reduced and carrier life time is shortened and the reliability of a gate insulating layer is improved.

It will be apparent to those skilled in the art that various modification and variations can be made in the semiconductor device and the method for fabricating the same of the present invention without departing from the spirit or scope of the inventions. Thus, it is intended that the present invention cover the modifications and variations of this invention provided they come within the scope of the appended claims and their equivalents.

What is claimed is:

1. A method for fabricating a semiconductor device comprising the steps of:

forming a buried insulating layer in a substrate;

burying an insulating layer in predetermined areas of the substrate to contact with the buried insulating layer to form device isolating layers;

forming a gate insulating film on the substrate and forming a gate electrode having a cap insulating film;

performing an LDD ion implanting process with the gate electrtode serving as a mask and forming sidewall spacers on both sides of the gate electrode to have a thickness of thicker than the gate electrode;

removing the cap insulating layer and implanting Ar ions into the entire surface to form a damage layer at boundary of the buried insulating layer under the gate electrode; and implanting impurity ions into the substrate at both sides of the gate electrode to form source/drain regions.

2. The method as claimed in claim 1, wherein the source/drain regions are formed by implanting impurity ions of a conductivity type that is opposite to the substrate.

3. The method as claimed in claim 2, wherein the source/drain regions are of n type and the substrate is of p type.

4. The method as claimed in claim 1, wherein the step of forming the device isolating films includes the steps of:

forming trenches in predetermined areas of the substrate;

burying an insulating material in the trenches; and performing a LOCOS process.

5. The method as claimed in claim 1, wherein the gate electrode is formed of an undoped polysilicon layer, an in-situ doped polysilicon layer, a stack of a polysilicon layer and a silicide, or a stack of a polysilicon layer and a metal.

6. The method as claimed in claim 1, wherein a location of the damage layer is adjusted by a thickness of the gate electrode, a thickness of the buried insulating layer, and an ion implanting energy.

7. The method as claimed in claim 6, wherein the buried insulating layer is 800~2000 Angstrom thick.

8. The method as claimed in claim 6, wherein the gate electrode is 1000~2000 Angstrom thick.

9. The method as claimed in claim 6, wherein a concentration of the ions is $1\times10^{14} cm^{2.}$ 10. The method as claimed in claim 1, further comprising the step of:

forming a silicide layer on the source/drain regions.

11. The method as claimed in claim 1, wherein the cap insulating layer is made of a material having a high etch ratio with the sidewall spacers.

12. The method as claimed in claim 1, wherein Si ions or Ge ions are used instead of the Ar ions.

* * * * *